US006410101B1

(12) United States Patent
Jaskie et al.

(10) Patent No.: US 6,410,101 B1
(45) Date of Patent: Jun. 25, 2002

(54) METHOD FOR SCRUBBING AND PASSIVATING A SURFACE OF A FIELD EMISSION DISPLAY

(75) Inventors: James E. Jaskie; Albert Alec Talin, both of Scottsdale, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/505,124

(22) Filed: Feb. 16, 2000

(51) Int. Cl.[7] .......................... C23C 14/06; C23C 14/34; H05H 1/24; B05D 5/12

(52) U.S. Cl. ........................ 427/524; 427/525; 427/534; 427/577; 427/77; 427/78; 204/192.15; 204/192.3; 204/192.38

(58) Field of Search ................................. 427/524, 525, 427/527, 528, 529, 530, 531, 534, 537, 562, 563, 564, 576, 577, 578, 77, 78; 204/192.15, 192.17, 192.22, 192.23, 192.27, 192.29, 192.3, 192.38

(56) References Cited

U.S. PATENT DOCUMENTS

| | | | | | |
|---|---|---|---|---|---|
| 3,021,271 | A | | 2/1962 | Wehner | |
| 3,540,989 | A | | 11/1970 | Webb | |
| 3,875,028 | A | * | 4/1975 | Atlee et al. | 204/192.3 |
| 4,153,529 | A | * | 5/1979 | Little et al. | 204/192.15 |
| 4,307,507 | A | * | 12/1981 | Gray et al. | 313/309 |
| 4,402,993 | A | * | 9/1983 | Aisenberg et al. | 427/534 |
| 4,412,903 | A | * | 11/1983 | Green et al. | 204/192.3 |
| 4,607,193 | A | * | 8/1986 | Curren et al. | 204/192.15 |
| 4,786,352 | A | * | 11/1988 | Benzing | 156/345 |
| 4,992,298 | A | * | 2/1991 | Deutchman et al. | 427/534 |
| 5,244,428 | A | | 9/1993 | Welsch et al. | |
| 5,292,682 | A | * | 3/1994 | Stevens et al. | 438/144 |
| 5,318,928 | A | | 6/1994 | Gegenwart et al. | |
| 5,580,380 | A | | 12/1996 | Liu et al. | |
| 5,616,373 | A | | 4/1997 | Karner et al. | |
| 5,837,331 | A | * | 11/1998 | Menu et al. | 427/577 |
| 5,982,082 | A | | 11/1999 | Janning | |
| 6,091,190 | A | * | 7/2000 | Chalamala et al. | 313/309 |
| 6,201,342 | B1 | * | 3/2001 | Hobart et al. | 313/309 |
| 6,259,838 | B1 | * | 7/2001 | Singh et al. | 385/31 |

FOREIGN PATENT DOCUMENTS

| | | |
|---|---|---|
| FR | 2760755 | 9/1998 |
| WO | 99/26281 | 5/1999 |
| WO | 99/63567 | 12/1999 |

OTHER PUBLICATIONS

R.F. Bunshan, Ed., *Handbook of Deposition Technologies for Films amd Coatings,* 2nd ed. Noyes Publications, Westwood, N.J., USA, Excerts pp. 249 & 258–275, 1994 (no month).*

* cited by examiner

*Primary Examiner*—Marianne Padgett
(74) *Attorney, Agent, or Firm*—Kevin D. Wills; William E. Koch; Frank J. Bogacz

(57) ABSTRACT

A method for scrubbing and passivating an anode plate (100) of a field emission display (120) includes the steps of providing a scrubbing passivation material (127); imparting to scrubbing passivation material (127) an energy selected to cause removal of a contamination layer (123, 117) from anode plate (100); causing scrubbing passivation material (127) to be received by contamination layer (123, 117), thereby removing contamination layer (123, 117); and depositing at least a portion of scrubbing passivation material (127) on anode plate (100), thereby forming a passivation layer (129).

6 Claims, 1 Drawing Sheet

METHOD FOR SCRUBBING AND PASSIVATING A SURFACE OF A FIELD EMISSION DISPLAY

FIELD OF THE INVENTION

The present invention relates, in general, to methods for scrubbing surfaces of field emission displays, and, more particularly, to methods for scrubbing anode plates of high voltage field emission displays.

BACKGROUND OF THE INVENTION

Field emission displays (FED's) are known in the art. High voltage FED's are operated at anode voltages that are greater than about 1000 volts. A typical high voltage anode plate includes a transparent substrate upon which is formed an anode, which typically is made from indium tin oxide. Cathodoluminescent phosphors are disposed on the anode. It is also known to provide an aluminum layer on the cathodoluminescent phosphors in order to improve brightness. The aluminum layer improves the brightness of the display image by reflecting toward the viewer light that is initially directed away from the viewer. Because of the high voltage operation, incident electrons are able to traverse the aluminum layer to activate the cathodoluminescent phosphors.

However, aluminum oxide ($Al_2O_3$), which is known to exist at the outer surface of the aluminum layer, readily forms hydrates. The water from the hydrates can be liberated into the vacuum of the FED when the aluminum layer is struck by the emission current. Furthermore, it is known that aluminum oxide can be decomposed by electron bombardment, thereby evolving oxygen into the vacuum of the FED. It is known that the presence of water and oxygen are undesirable because they can react with the electron emitter structures, thereby contaminating them and causing deterioration of their emissive properties.

It is known in the vacuum industry to clean and passivate surfaces of vacuum devices using two distinct steps. The first step consists of scrubbing the contaminated surface with a scrubbing agent, such as an electron beam, an ion beam, or ultraviolet light. The second step consists of subsequently depositing a carbon layer on the scrubbed surface. The carbon layer is known to act as a passivation layer. However, this multi-step prior art scheme is time consuming and requires distinct process equipment and/or different materials for each step.

Accordingly, there exists a need for a method for scrubbing an anode plate of a field emission display, which overcomes at least these shortcomings of the prior art.

Figure 1:
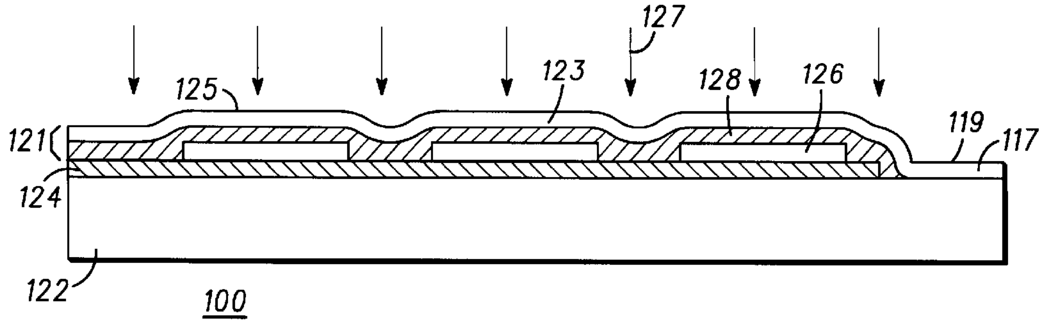
FIG. 1 is a cross-sectional view of a contaminated anode plate upon which are performed steps of a method, in accordance with the invention.

It will be appreciated that for simplicity and clarity of illustration, elements shown in the drawings have not necessarily been drawn to scale. For example, the dimensions of some of the elements are exaggerated relative to each other. Further, where considered appropriate, reference numerals have been repeated among the drawings to indicate corresponding elements.

DESCRIPTION OF THE PREFERRED EMBODIMENTS

The invention is for a method for scrubbing and passivating a surface of a field emission display. One benefit of the method of the invention is that it allows the scrubbing and the formation of a passivation layer to be achieved using one agent in one continuous step. The method of the invention can be performed in less time than prior art scrubbing and passivating schemes. In the method of the invention, a scrubbing passivation material removes a contamination layer from the surface of the field emission display. Simultaneously or immediately thereafter, the scrubbing passivation material is deposited on the surface to form a passivation layer.

FIG. 1 is a cross-sectional view of a contaminated anode plate 100 upon which are performed steps of a method, in accordance with the invention. Anode plate 100 includes a transparent substrate 122, which is made from a hard, transparent material, such as, for example, soda lime glass. An anode 124 is disposed upon transparent substrate 122. Anode 124 is made from a transparent, conductive material, such as indium tin oxide. A plurality of phosphors 126 are disposed on anode 124. Methods for depositing phosphors for field emission displays are known to one of ordinary skill in the art.

A first layer 121 is disposed on phosphors 126 and defines a surface 125. First layer 121 has a reflective layer 128 and a contamination layer 123. First layer 121 is formed by depositing a reflective material upon phosphors 126. Contamination layer 123 is formed upon exposure of the reflective material to air. Contamination layer 123 can include hydrates and oxides. Transparent substrate 122 defines a surface 119 and has another contamination layer 117, which is also realized on upon exposure to air. Contamination layers 123 and 117 are undesirable because they constitute sources of contaminants, which can be released into the vacuum of a field emission display when anode plate 100 is incorporated therein.

A method for scrubbing and passivating surfaces 125 and 119, in accordance with the invention, includes the step of providing a scrubbing passivation material 127, which is represented by arrows in FIG. 1. The method of the invention further includes the step of imparting to scrubbing passivation material 127 an energy selected to cause removal of contamination layers 123 and 117. The method of the invention further includes the step of causing scrubbing passivation material 127 to be received by surfaces 125 and 119, thereby removing contamination layers 123 and 117.

Figure 2:
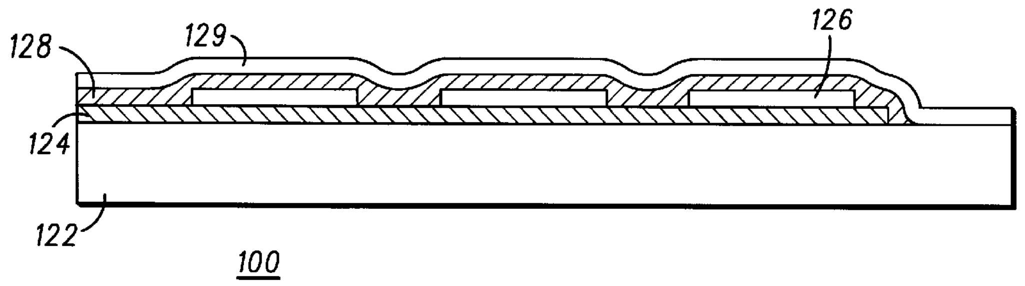
FIG. 2 is a cross-sectional view of an anode plate realized by performing various steps of a method, in accordance with the invention.

FIG. 2 is a cross-sectional view of anode plate 100 realized by performing various steps of a method, in accordance with the invention. The method of the invention further includes the step of depositing at least a portion of scrubbing passivation material 127 on the surfaces 125 and 119, thereby forming a passivation layer 129, which is shown in FIG. 2.

Preferably, reflective layer 128 is made from a material selected from the group consisting of aluminum, gold, titanium, platinum, and palladium. Most preferably, reflective layer 128 is made from aluminum.

Preferably, the step of providing scrubbing passivation material 127 includes the step of providing a material selected from the group consisting of silicon, silicon carbide, aluminum nitride, magnesium oxide, boron carbide, aluminum carbide, beryllium carbide, carbon, titanium, titanium dioxide, platinum, gold, palladium, titanium nitride, and tantalum nitride. Preferably, deposition conditions are selected so that passivation layer 129 is amorphous. An amorphous material provides an effective diffusion barrier because it lacks the grain boundaries and crystal defects through which gases easily migrate.

More preferably, the step of providing scrubbing passivation material 127 includes the step of providing a low-Z material selected from the group consisting of silicon, silicon carbide, aluminum nitride, magnesium oxide, boron carbide, aluminum carbide, beryllium carbide, and carbon. A material having a lower atomic number (low-Z material) improves the ability of electrons to pass through passivation layer 129. Most preferably, the step of providing scrubbing passivation material 127 includes the step of providing carbon.

When carbon is employed, the step of imparting to scrubbing passivation material 127 an energy selected to cause removal of a contamination layer 123 preferably includes the step of imparting to the carbon an energy equal to at least 400 electronvolts. Most preferably, the energy is within a range of 400–500 electronvolts. Most preferably, the deposition conditions are further selected to form $sp^3$-bound carbon. The $sp^3$-bound carbon provides an excellent diffusion barrier. The carbon can be deposited using one of several known carbon-deposition techniques, such as plasma-enhanced chemical vapor deposition, carbon sputtering, carbon arc deposition, and the like.

Figure 3:
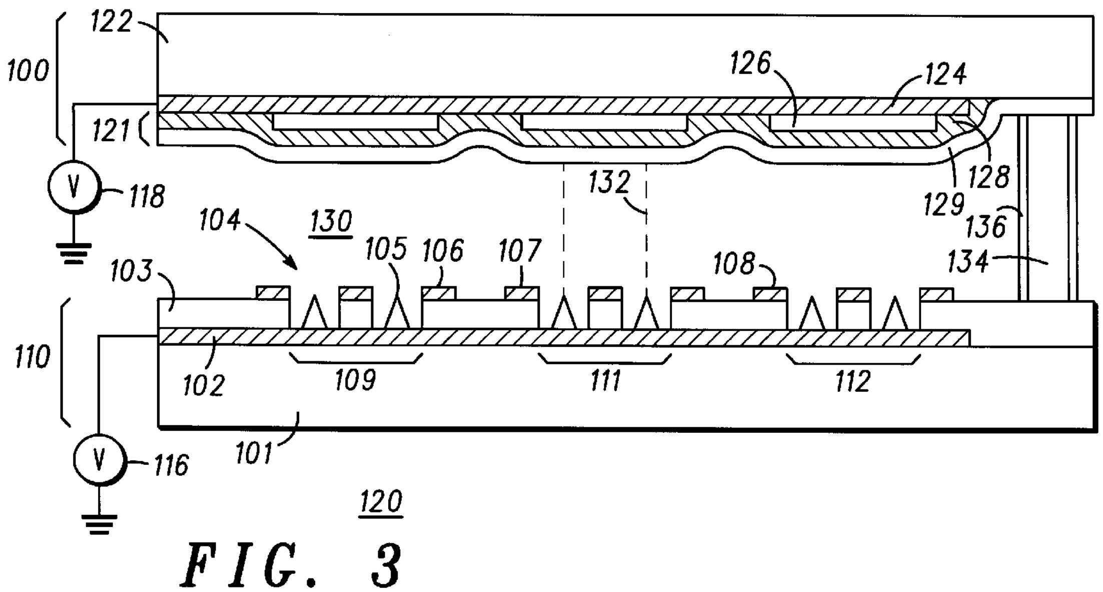
FIG. 3 is a cross-sectional view of a field emission display realized by performing various steps of a method for fabricating a field emission display, in accordance with the invention.

FIG. 3 is a cross-sectional view of a field emission display 120 realized by performing various steps of a method for fabricating a field emission display, in accordance with the invention. Field emission display 120 includes anode plate 100, which is fabricated in the manner described with reference to FIGS. 1 and 2.

Field emission display 120 further includes a cathode plate 110. Anode plate 100 and cathode plate 110 are spaced apart to define an interspace region 130 therebetween.

Cathode plate 110 includes a substrate 101, which can be made from glass, silicon, and the like. A cathode 102 is disposed upon substrate 101. Cathode 102 is connected to a first independently controlled voltage source 116. A dielectric layer 103 is disposed upon cathode 102 and further defines a plurality of emitter wells 104.

An electron emitter structure 105, such as a Spindt tip, is disposed in each of emitter wells 104. Electron emitter structures 105 are the electron-emissive structures of cathode plate 110, which are useful for generating the display image.

A first gate extraction electrode 106 is disposed on dielectric layer 103. At the location of the overlap of first gate extraction electrode 106 with cathode 102 is defined a first sub-pixel 109. Similarly, at the location of the overlap of a second gate extraction electrode 107 and a third gate extraction electrode 108 with cathode 102 are defined a second sub-pixel 111 and a third sub-pixel 112, respectively. Each of sub-pixels 109, 111, and 112 is useful for causing one of a plurality of phosphors 126 to emit light. Gate extraction electrodes 106, 107, and 108 are connected to a second independently controlled voltage source (not shown). Methods for fabricating cathode plates for matrix-addressable field emission displays are known to one of ordinary skill in the art.

Anode plate 100 is disposed to receive a plurality of emission currents 132 emitted by electron emitter structures 105. Passivation layer 129 is at least useful for preventing transmission of one or more contaminants through passivation layer 129 and into interspace region 130. Passivation layer 129 can function as a barrier to contaminants, such as $H_2O$, $O_2$, $CO$, $N_2$, and $CO_2$. Passivation layer 129 is also preferably hydrophobic, so that re-adsorption of water and other oxidizers occurs at a low rate.

Field emission display 120 is operated by applying potentials to gate extraction electrodes 106, 107, and 108, and to cathode 102 for causing selective emission of electrons from electron emitter structures 105. A potential is also applied to anode 124 for attracting the electrons thereto. This is achieved by using a third independently controlled voltage source 118, which is connected to anode 124. The electrons traverse first layer 121 and activate phosphors 126 with sufficient energy to produce a useful level of brightness. Reflective layer 128 improves the brightness of the display image by reflecting toward the viewer light that is initially directed away from the viewer.

As further illustrated in FIG. 3, field emission display 120 further includes a spacer 134, which is useful for maintaining the separation distance between anode plate 100 and cathode plate 110. Spacer 134 is preferably made from a dielectric material. In the preferred embodiment of FIG. 3, spacer 134 has a spacer passivation layer 136. Spacer 134 is scrubbed and passivated using the method of the invention, as described with reference to FIGS. 1 and 2.

In summary, the invention is for a method for scrubbing and passivating a surface of a field emission display. The method of the invention utilizes one agent to perform both the scrubbing and passivating functions. By obviating the need for different agents, the method of the invention is faster than prior art scrubbing and passivating schemes.

While we have shown and described specific embodiments of the present invention, further modifications and improvements will occur to those skilled in the art. For example, the method of the invention can be used to scrub and passivate surfaces defined by the cathode plate.

We desire it to be understood, therefore, that this invention is not limited to the particular forms shown, and we intend in the appended claims to cover all modifications that do not depart from the spirit and scope of this invention.

We claim:

1. A method for scrubbing and passivating an anode plate of a field emission display comprising the steps of: providing the anode plate comprising a transparent, conductive material;

providing a scrubbing passivation material which is a carbon;

imparting to the scrubbing passivation material an energy selected to cause removal of a contamination layer from the anode plate; comprising the step of imparting to the carbon the energy within a range of 400–500 electronvolts;

causing the scrubbing passivation material to be received by the contamination layer, thereby removing the contamination layer; and depositing at least a portion of the scrubbing passivation material on the anode plate, thereby forming a passivation layer.

2. The method for scrubbing and passivating an anode plate of a field emission display as claimed in claim 1, wherein the anode plate has a reflective layer, wherein the contamination layer is disposed on the reflective layer, and wherein the reflective layer is made from a material selected from the group consisting of aluminum, gold, titanium, platinum, and palladium.

3. The method for scrubbing and passivating an anode plate of a field emission display as claimed in claim 2, wherein the reflective layer is made from aluminum.

4. The method for scrubbing and passivating an anode plate of a field emission display as claimed in claim 1, wherein the step of depositing at least a portion of the scrubbing passivation material on the anode plate comprises the step of forming $sp^3$-bound carbon on the anode plate.

5. The method for scrubbing and passivating an anode plate of a field emission display as claimed in claim 1, wherein the step of depositing at least a portion of the scrubbing passivation material on the anode plate comprises the step of forming an amorphous layer on the anode plate.

6. The method for scrubbing and passivating an anode plate of a field emission display as claimed in claim 1 wherein the anode plate comprising the transparent, conductive material includes indium tin oxide.

* * * * *